US006756666B2

(12) United States Patent
Hosomi

(10) Patent No.: US 6,756,666 B2
(45) Date of Patent: Jun. 29, 2004

(54) SURFACE MOUNT PACKAGE INCLUDING TERMINAL ON ITS SIDE

(75) Inventor: Takahiro Hosomi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/734,662

(22) Filed: Dec. 13, 2000

(65) Prior Publication Data

US 2001/0040287 A1 Nov. 15, 2001

(30) Foreign Application Priority Data

Dec. 24, 1999 (JP) ............................................ 11-368320

(51) Int. Cl.$^7$ .......................................... H01L 257/693
(52) U.S. Cl. ...................... 257/693; 257/690; 257/691; 257/730; 257/731; 257/773; 257/778; 257/786; 438/612; 438/617
(58) Field of Search ................................ 257/693, 692, 257/691, 690, 725, 724, 723, 730, 731, 778, 786, 773, 784; 438/612, 617

(56) References Cited

U.S. PATENT DOCUMENTS 3,711,626 A * 1/1973 Kilby et al. ................. 174/251
3,813,578 A * 5/1974 Tiffany .......................... 361/88
4,530,002 A    7/1985 Kanai (List continued on next page.)

FOREIGN PATENT DOCUMENTS

| EP | 0 862 213 A2 | 9/1998 |
|---|---|---|
| EP | 0 862 213 A3 | 9/1998 |
| JP | 60076149 A * | 4/1985 |
| JP | 03-229449 | 10/1991 |
| JP | 5-243453 | 9/1993 |
| JP | 05-251616 | 9/1993 |
| JP | 07029858 A * | 1/1995 |
| JP | 07-147481 | 6/1995 |
| JP | 07-335814 | 12/1995 |
| JP | 08-191111 | 7/1996 |
| JP | 08-250620 | 9/1996 |
| JP | 9-205113 A | 8/1997 |
| JP | 9-307022 | 11/1997 |
| JP | 10-229142 | 8/1998 |
| JP | 11-17058 | 1/1999 |
| JP | 11-54654 | 2/1999 |
| JP | 11-74637 | 3/1999 |
| JP | 11-163215 A | 6/1999 |
| JP | 11-238830 | 8/1999 |
| JP | 11-307679 | 11/1999 |

OTHER PUBLICATIONS

Y. Shimazaki et al., "Damage Model in Stress Concentration Part for Fatigue Design CAD/CAE System", (Lecture Theses at Lecture Meeting of Material Strength Department in Japanese Mechanical Institute), vol. A, (1998), pp. 13–16 with English Abstract.

J.H. Beynon et al., "Engineering Against Fatigue", (Proceedings of an International Conference of the Importance of Understanding the Fundamentals of the Fatigue Process in Counteracting its Effects in Engineering Components and Structures, and to Reflect on the Contribution of K.J. Miller, (1999), pp. 373–380.

Primary Examiner—Bradley Baumeister
Assistant Examiner—Chris C Chu
(74) Attorney, Agent, or Firm—Sughrue Mion, PLLC

(57) ABSTRACT

A surface mount package is composed of a package body and first and second terminals. The package body has first and second surfaces intersecting with each other. Also, the package body has an installing portion for an element to be installed. The first terminal is connected to the first surface, and the second terminal is connected to the second surface.

24 Claims, 13 Drawing Sheets

U.S. PATENT DOCUMENTS

| | | | |
|---|---|---|---|
| 4,551,747 A | * 11/1985 | Gilbert et al. | 257/691 |
| 4,839,716 A | * 6/1989 | Butt | 257/660 |
| 4,927,697 A | * 5/1990 | IHill | 428/198 |
| 5,157,480 A | 10/1992 | McShane et al. | |
| 5,561,696 A | * 10/1996 | Adams et al. | 378/58 |
| 5,563,446 A | 10/1996 | Chia et al. | |
| 5,684,677 A | * 11/1997 | Uchida et al. | 361/770 |
| 5,752,182 A | * 5/1998 | Nakatsuka et al. | 455/333 |
| 5,838,551 A | * 11/1998 | Chan | 361/818 |
| 6,150,636 A | * 11/2000 | Bogdanski et al. | 219/461.1 |
| 6,165,885 A | * 12/2000 | Gaynes et al. | 438/612 |

* cited by examiner

SURFACE MOUNT PACKAGE INCLUDING TERMINAL ON ITS SIDE

BACKGROUND OF THE INVENTION

1. Field of the Invention

The present invention relates to a surface mount package. More particularly, the present invention relates to a surface mount package having a high reliability of a junction with a printed circuit board.

2. Description of the Related Art

It is desirable that a semiconductor device is assembled in an electronic device at a high density. In the electronic device having a high density, a surface mount package is often used to install a semiconductor device. As one of the surface mount packages, a ball grid array package (hereafter, referred to as a BGA package) is known.

FIG. 1 is a view showing a structure of a conventional BGA package. The conventional BGA package 100 has a rectangular package body 101. A number of terminals 102 are joined to a rear surface of a package body 101. As shown in FIG. 2, a number of terminals 102 are arranged in the form of a matrix. A solder ball 103 is soldered and joined to each terminal 102. Each solder ball 103 is covered with a solder layer 104. The solder ball 103 functions as a terminal of a BGA package 100 to be connected to a printed circuit board. A semiconductor device 105 is placed in the package body 101.

FIG. 3 shows an electronic device including the above-mentioned conventional BGA package 100 and a printed circuit board 150. The BGA package is assembled to the printed circuit board 150. A pad 107 is mounted on a surface of a substrate 106. The pad 107 and the solder ball 103 of the BGA package 100 are soldered and joined to each other. The soldering is usually carried out through re-flow. That is, the pad 107 and the solder ball 103 are heated in the condition that they are in contact with each other, and the solder layer 104 is melted to join the solder ball 103 and the pad 107. The pad 107 and the ball 103 are joined to each other through a melted solder 104'.

When the BGA package 100 and the printed circuit board 150 are heated, a stress is induced because of a difference between thermal expansion coefficients of the package body 101 and the substrate 106. The induced stress acts on the solder ball 103. The induced stress is concentrated on solder balls 103-1 in the outermost circumference of the matrix, especially, on solder balls 103-2 at four corners. The solder balls 103-2 at the four corners are likely to be stripped from the pad 107 on the substrate 106, and its electrical mechanical reliability is poor.

The same problems are pointed out for a SON (Small Outline Carrier) package and a BCC (Bump Chip Carrier) package in which a land is used instead of the solder ball, as the terminal on the rear surface.

A technique for suppressing the strips of the solder balls 103-2 at the four corners from the pad 107 on the substrate 106 is disclosed in Japanese Laid Open Patent Application (JP-A-Heisei, 9-307022). The known BGA package has a plurality of solder balls arranged in the form of a matrix. Among the solder balls, solder balls positioned in the outermost circumference of the matrix have diameters longer than those of the other solder balls. Thus, a contact area between the solder balls in the outermost circumference and the pad on the substrate is wider to thereby strengthen the adhesion.

However, even if the diameters of the solder balls are longer, the stress acting on the solder balls at the four corners is not reduced.

Another BGA package is disclosed in Japanese Laid Open Patent Application (JP-A-Heisei, 11-17058). The BGA package has a structure for easily testing a semiconductor device mounted thereon. In the BGA package 210, an IC chip 211 is mounted on a surface of a substrate 212, as shown in FIG. 4. The IC chip 211 is connected through a bonding wire 216 to a wiring 213a on the surface of the substrate 212. The wiring 213a is connected through a through hole 214 to a wiring 213b on a rear. A solder bump 215 is connected to the wiring 213b. The wiring 213a is extending up to a side of the substrate 212. An Ni plate layer 219 and an Au plate layer 220 are connected to a portion of the wiring 213a arranged on the side of the substrate 212. The Ni plate 219 and the Au plate layer 220 are electrically connected through the wiring 213a and the bonding wire 216 to an electrode pad 211a on the IC chip 211. Moreover, the solder bump 215 is electrically connected through the wiring 213b, the through hole 214 and the wiring 213a to the electrode pad 211a. The Ni plate layer 219 and the Au plate layer 220 are used as a test pad 218 to be used when the IC chip 211 is tested.

FIG. 5 shows a structure of a socket 240 into which the BGA package 210 is inserted. The socket 240 contains an IC socket body 230, an IC socket contact element 231 and an outer terminal 232. The IC socket contact element 231 is in contact with the test pad 218. The IC socket contact element 231 is electrically connected to the outer terminal 232. The IC chip 211 can be tested by inputting or outputting a signal to or from the outer terminal 232 of the socket 240.

However, the above-mentioned technique is not intended to solve the problem that a stress is applied to the solder bump 215 when the BGA package 210 is installed in a printed circuit board.

Also, other surface mount packages are disclosed in Laid Open Japanese Patent Application (Jp-A-Heisei 5-243453, Jp-A-Heisei 11-54654, and Jp-A-Heisei 11-74637).

SUMMARY OF THE INVENTION

An object of the present invention is to reduce a stress acting on a junction between a surface mount package and a printed circuit board provided with the surface mount package, and thereby to improve an electrical mechanical reliability.

Another object of the present invention is to provide a surface mount package and an electronic circuit provided with it in which a stress is not concentrated on a particular terminal provided in the surface mount package.

In order to achieve an aspect of the present invention, a surface mount package is composed of a package body, and first and second terminals. The package body has first and second surfaces intersecting with each other, and has an installing portion for an element to be installed. The first terminal is connected to the first surface, and the second terminal is connected to the second surface.

The second terminal is desirably used for connection to a printed circuit board by a conductive section formed of solder.

Also, the second terminal desirably extends from a first intersection line at which the first and second surfaces intersect, in a direction that is vertical to the first intersection line and parallel to the first surface.

It is also desirable that the second terminal extends from a first intersection line at which the first and second surfaces intersect, in another direction that is vertical to the first intersection line and parallel to the second surface.

The package body may further have a third surface intersecting to the second surface. In this case, the second terminal desirably extends in the direction to reach the second intersection line.

The second terminal desirably extends from the second intersection line in still another direction that is vertical to the second intersection line and parallel to the third surface.

The first surface may be a polygon having sides and an angle between the sides. In this case, the second terminal is desirably arranged in a portion corresponding to the angle.

The second terminal may be electrically connected to the element.

Also, the second terminal may be electrically isolated from the element.

The first terminal may include matrix terminals arranged to form a matrix, and the matrix terminals may include a corner terminal at a corner of the matrix. In this case, the second terminal is desirably close to the corner terminal such that the corner terminal is prevented from being peeled off from a printed circuit board when a stress is acted on a junction between the corner terminal and the printed circuit board.

The element may be a semiconductor device.

The first terminal may include a ball coated with solder.

The first terminal may be a land.

In order to achieve another aspect of the present invention, an electronic device is composed of a surface mount package and a printed circuit board. The surface mount package includes a package body and first and second terminals. The package body has first and second surfaces intersecting with each other, and has an installing portion for an element to be installed. The first terminal is connected to the first surface, and the second terminal is connected to the second surface. The printed circuit board includes a substrate, and third and fourth terminals connected to the substrate. The third terminal is fixed to the first terminal and the fourth terminal is fixed to the second terminal.

The fourth terminal is desirably fixed to the second terminal with a conductive portion formed of solder.

The printed circuit board may further include another element. In this case, the fourth terminal is electrically isolated from the other element.

The fourth terminal may be earth grounded.

In order to achieve still another aspect of the present invention, a method of fabricating an electronic device is composed of
  providing a surface mount package including
    a package body having first and second surfaces intersecting with each other, and having a installing portion in which an element is to be installed,
    a first terminal connected to the first surface, and
    a second terminal connected to the second surface;
  providing a printed circuit board including:
    a substrate, and
    third and fourth terminals connected to the substrate;
  connecting the first and third terminals; and
  connecting the second and fourth terminals.

The connecting second and fourth terminals desirably includes fixing the second and fourth terminals with solder.

DESCRIPTION OF THE PREFERRED EMBODIMENTS

Figure 6:
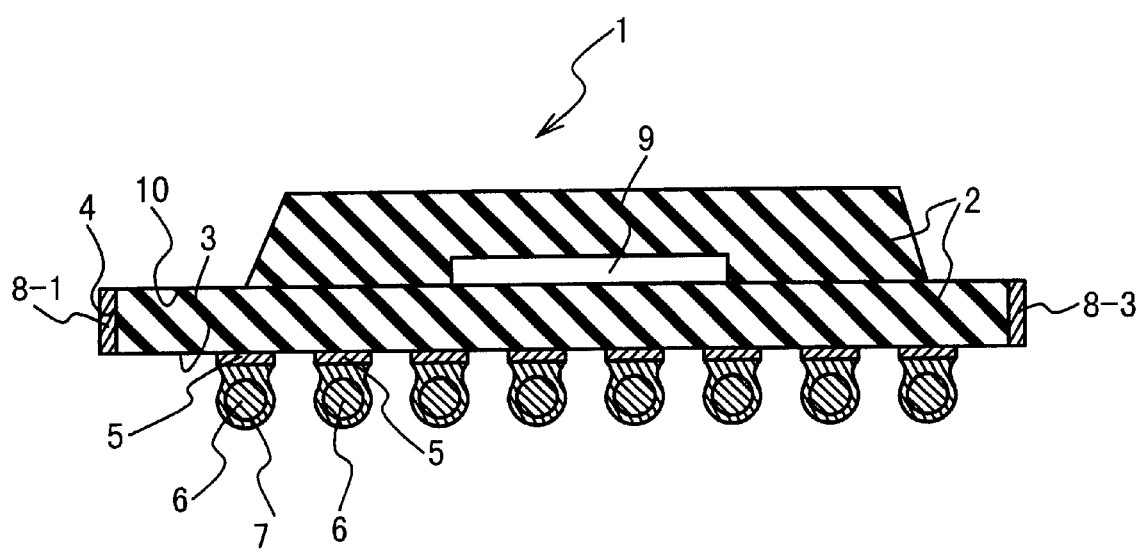
FIG. 6 is a section view showing a structure of a semiconductor package of a first embodiment.

With referring to the attached drawings, a 5 surface mount package of an embodiment according to the present invention has a package body. A package body 2 has a rear surface 3, a side surface 4 and a surface 10 as shown in FIG. 6. The side surface 4 is vertically intersecting with the rear surface 3. The surface 10 is substantially parallel to the rear surface 3. A number of rear terminals 5 are joined to the rear surface 3. A solder ball 6 is joined to each rear terminal 5. The solder ball 6 is soldered to the rear terminal 5. The rear terminal 5 and the solder ball 6 serve as terminals to be connected to a printed circuit board. A surface of the solder ball 6 is covered with a solder layer 7 formed of solder.

Figure 7:
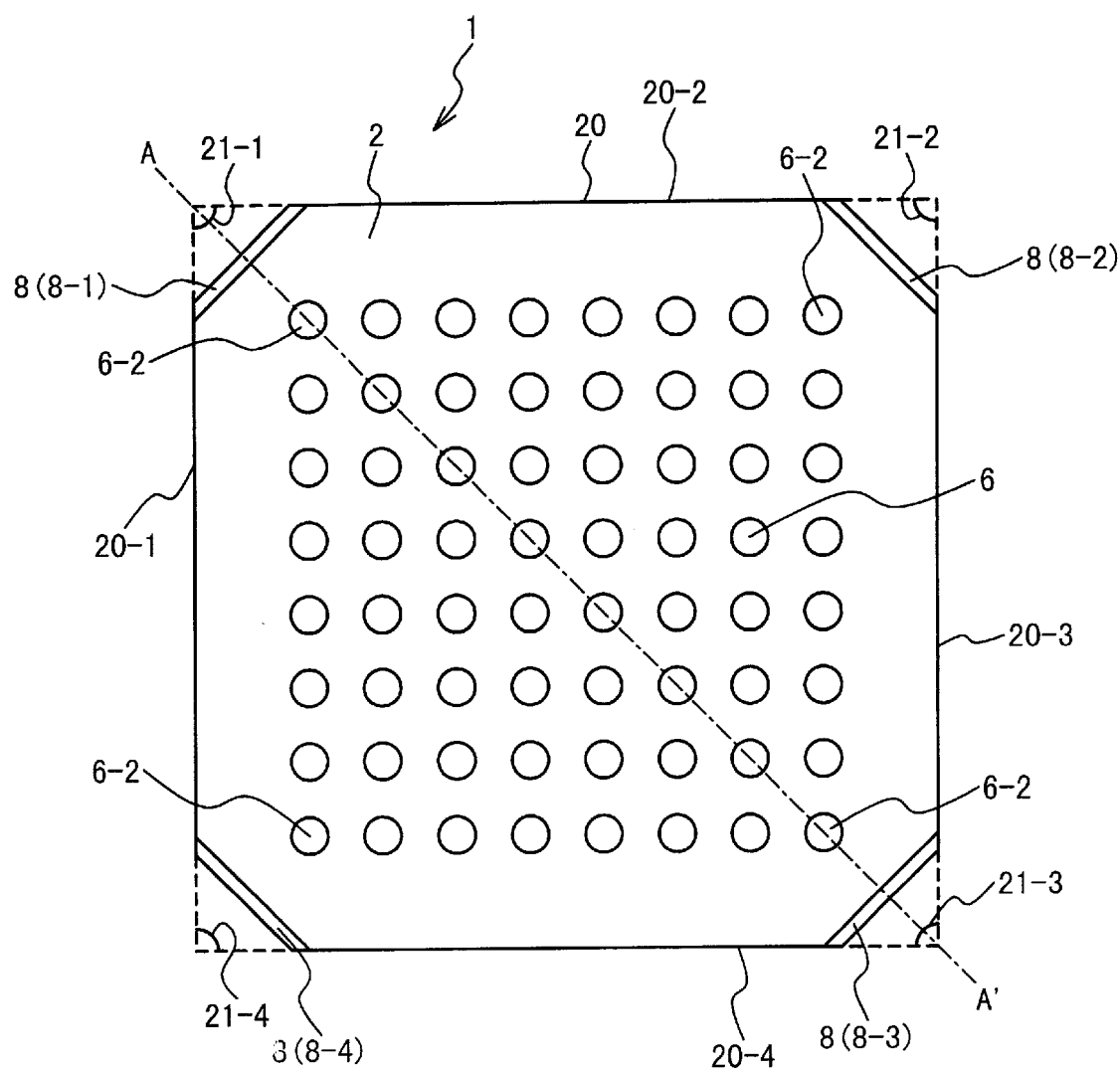
FIG. 7 is a plan view showing a structure of the semiconductor package of the first embodiment.

As shown in FIG. 7, the rear surface 3 of the package body 2 substantially has a shape of a square 20. The rear surface 3 has the shape in which corners of the square 20 are cut off. The square 20 has sides 20-1, 20-2, 20-3 and 20-4. The sides 20-1, 20-2 give an angle 21-1, the sides 20-2, 20-3 give an angle 21-2, the sides 20-3, 20-4 give an angle 21-3, and the sides 20-4, 20-1 give an angle 21-4.

Figure 8:
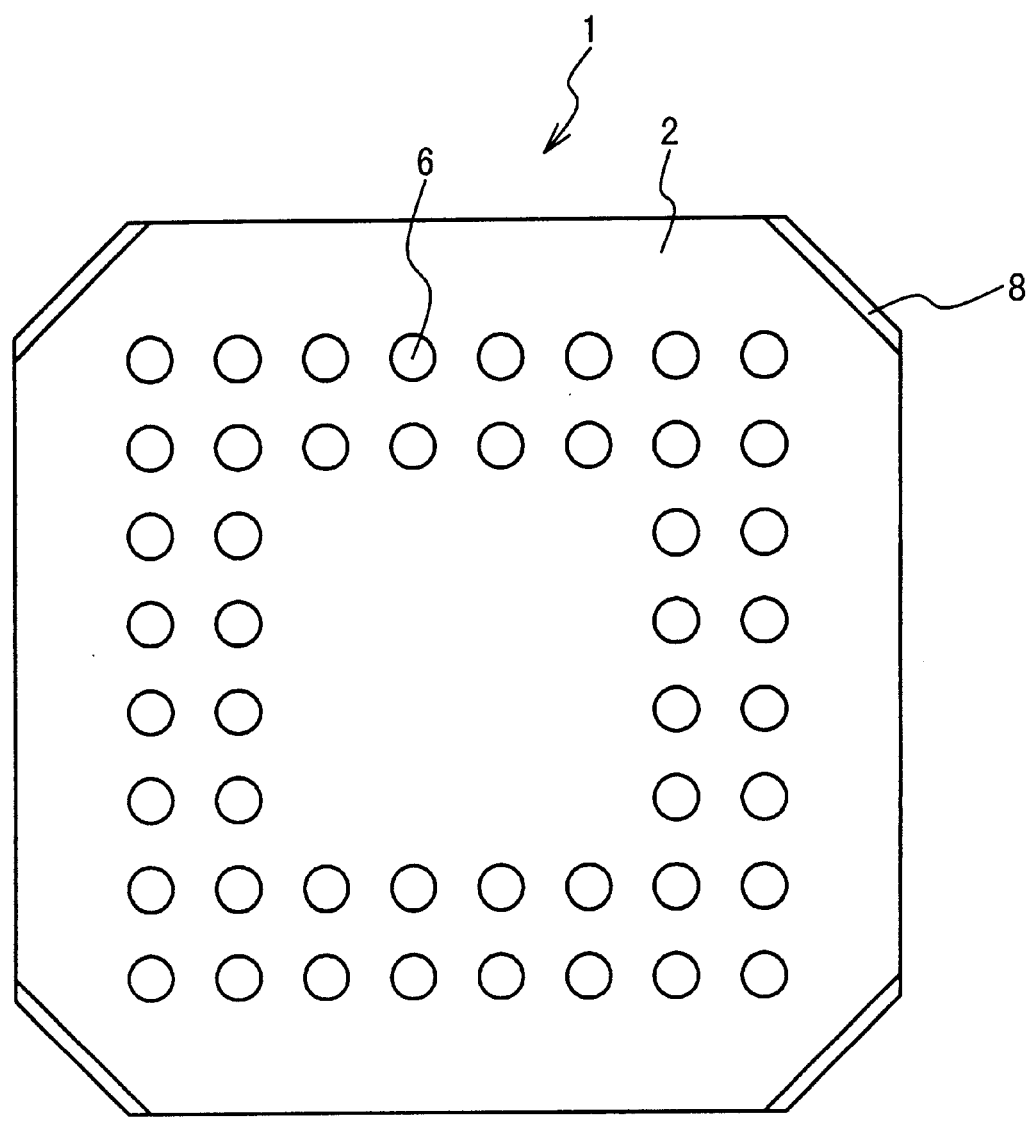
FIG. 8 is a plan view showing a first variation of the structure of the semiconductor package of the first embodiment.
Figure 9:
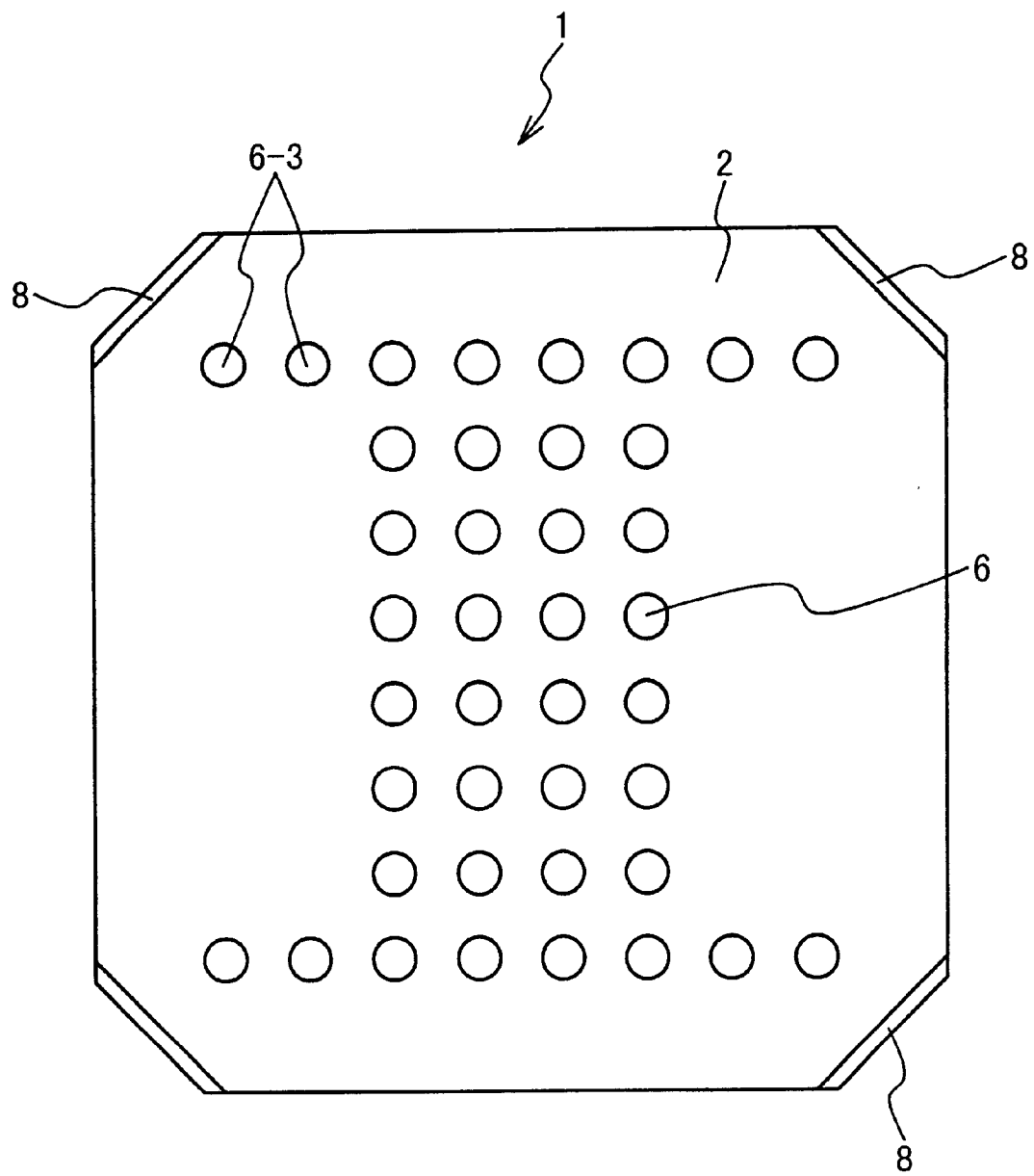
FIG. 9 is a plan view showing a second variation of the structure of the semiconductor package of the first embodiment.

The rear terminal 5 and the solder ball 6 are arranged on the rear surface 3 in the form of a matrix. However, the rear terminal 5, which is concealed by the solder ball 6, is not shown in FIG. 7. The rear terminal 5 and the solder ball 6 can be arranged in the form of a matrix in which a part of them is omitted, as shown in FIG. 8. Also, as shown in FIG. 9, the rear terminal 5 and the solder ball 6 and an additional solder ball 6-3 can be arranged in the form of a matrix.

Side terminals 8 are joined to the side surface 4, as shown in FIGS. 6, 7. The side terminals 8 are formed in the vicinities of the angles 21-1 to 21-4, respectively. Strong stresses are induced in the vicinities of the angles 21-1, to 21-4. The formation of the side terminals 8 in the vicinities of the angles 21-1 to 21-4 enables the induced stress to be effectively dispersed and reduced.

The side terminals 8 are positively close to solder balls 6-2 at the four corners of the solder balls 6 arranged in the form of the matrix. The strongest stresses act on the solder balls 6-2 at the four corners. The formation of the side terminals 8 in the vicinities of the solder balls 6-2 at the four corners is effective in dispersing and reducing the stresses acting on the solder balls 6-2 at the four corners. The side terminals 8 are desirably close to the solder balls 6-2 such that the solder balls 6-2 are prevented from being peeled off from a printed circuit board by a stress acting on the solder balls 6-2 when the BGA package 1 is installed to the printed circuit board.

Figure 10:
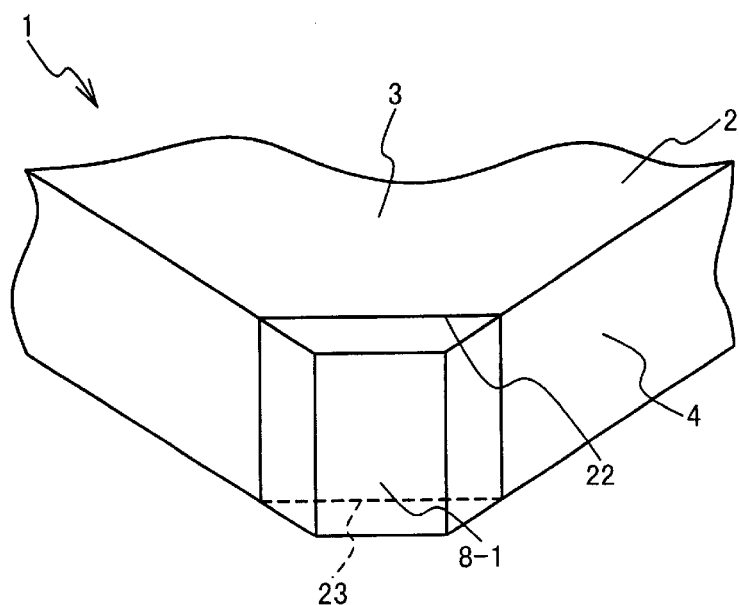
FIG. 10 is an enlarged view enlarging a corner of the semiconductor package of the first embodiment.

FIG. 10 is an enlarged view showing one corner among the four corners of the surface mount package 1. The rear surface 3 and the side surface 4 give a first intersection line 22. The side surface 4 and the surface 10 give a second intersection line 23. The side terminal 8 is mounted between the first and second intersection lines 22, 23, and the side terminal 8 bridges first and second intersection lines 22, 23.

As shown in FIG. 6, a semiconductor device 9 is installed in the package body 2. The semiconductor device 9 and the side terminals 8(8-1, 8-2, 8-3, 8-4) are electrically connected to each other. In another embodiment, the semiconductor device 9 and the side terminals 8(8-1, 8-2, 8-3, 8-4) are not electrically connected to each other.

Figure 11:
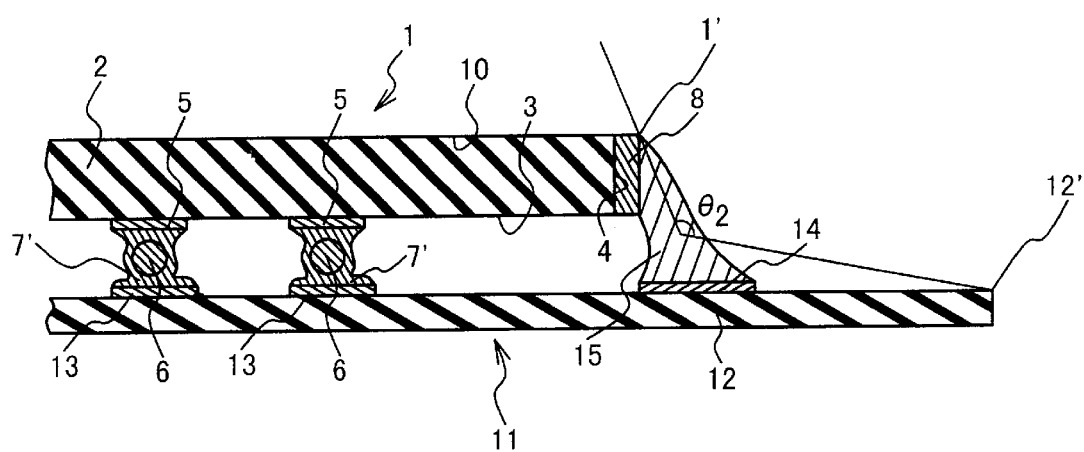
FIG. 11 is a section view showing a structure of an electric part of the first embodiment.

FIG. 11 shows the structure of the electronic device in the first embodiment. The electronic device is provided with the above-mentioned surface mount package 1 and a printed circuit board 11. The detailed structure thereof is as described above. The surface mount package 1 is coupled to the printed circuit board 11.

The printed circuit board 11 has a substrate 12. A first pad 13 and a second pad 14 are joined to a surface of the substrate 12. The first and second pads 13, 14 are electrically connected to another electronic element (not shown) mounted on the printed circuit board 11.

The solder ball 6 of the surface mount package 1 and the first pad 13 of the printed circuit board 11 are joined to each other through a first solder coupling 7' by soldering. The first solder coupling 7' is formed when a solder layer 7 formed on a surface of the solder ball 6 is heated and melted. Moreover, the side terminal 8 of the surface mount package 1 and the second pad 14 are joined to each other through a second solder coupling 15 by soldering.

The method for manufacturing the electronic device in the first embodiment will be described below. A re-flow is carried out in a condition that the solder ball 6 and the first pad 13 are in contact with each other. The heat applied to the surface mount package 1 during the re-flow causes the solder layer 7 to be melt, and the solder layer 7 becomes the first solder coupling 7'. The solder ball 6 and the first pad 13 are joined through the first solder coupling 7' to each other. In succession, the side terminal 8 and the second pad 14 are joined by soldering. Then, the process for manufacturing the electronic device is completed.

The shapes of the side surface 4 and the side terminal 8 are not limited to the above-mentioned shapes. Examples of the shapes of the side surface 4 and the side terminal 8 are shown in FIGS. 12 to 18. Here, the first intersection line 22 and the second intersection line 23 are extending in a direction vertical to a paper surface, in FIGS. 12 to 18.

Figure 12:
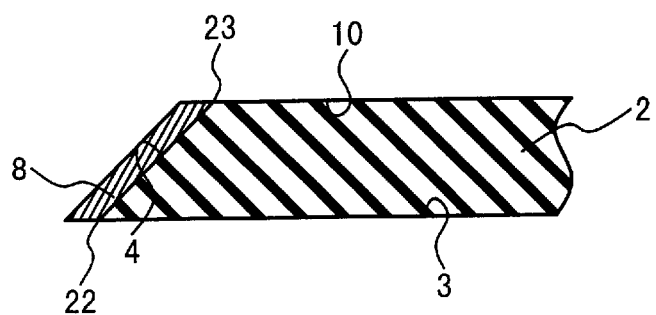
FIG. 12 is a view showing a first variation of a structure of a side terminal of the semiconductor package of the first embodiment.
Figure 13:
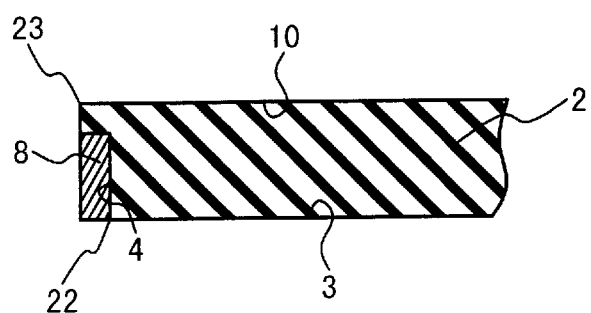
FIG. 13 is a view showing a second first variation of the structure of the side terminal of the semiconductor package of the first embodiment.
Figure 17:
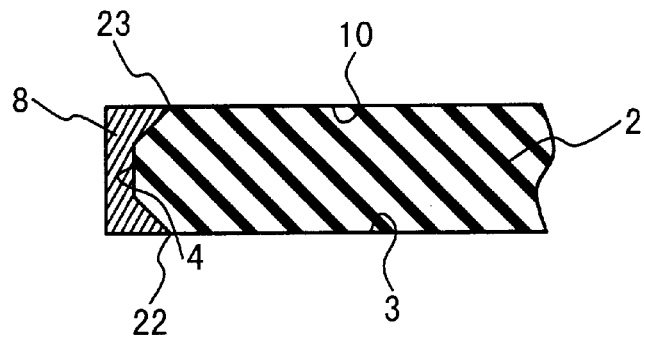
FIG. 17 is a view showing a sixth variation of the structure of the side terminal of the semiconductor package of the first embodiment.
Figure 18:
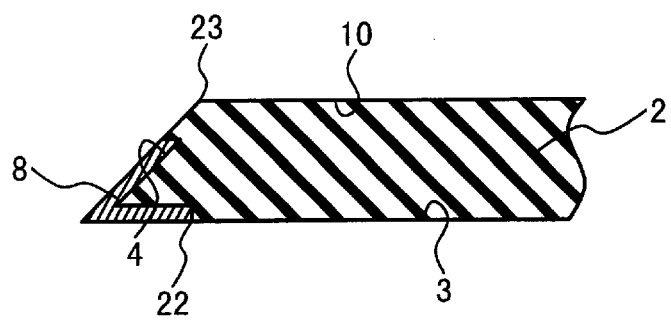
FIG. 18 is a view showing a seventh variation of the structure of the side terminal of the semiconductor package of the first embodiment.

As shown in FIGS. 12, 17 and 18, the side surface 4 can intersect with the rear surface 3 at a predetermined angle in which it is not vertical to the rear surface 3.

Figure 14:
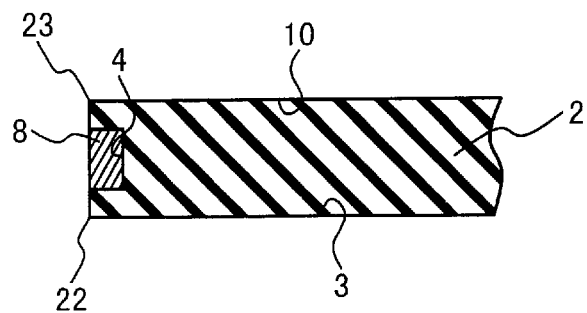
FIG. 14 is a view showing a third variation of the structure of the side terminal of the semiconductor package of the first embodiment.
Figure 15:
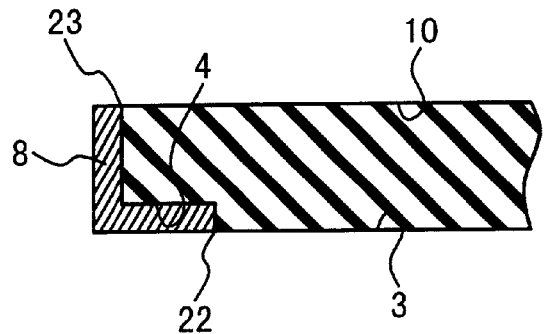
FIG. 15 is a view showing a fourth variation of the structure of the side terminal of the semiconductor package of the first embodiment.
Figure 16:
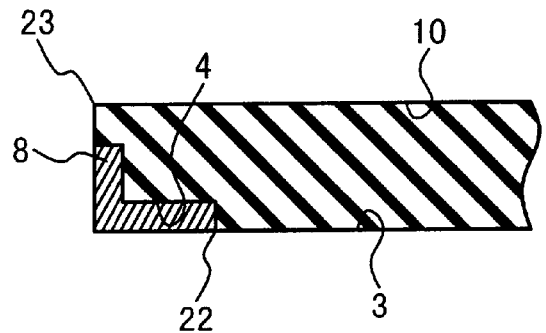
FIG. 16 is a view showing a fifth variation of the structure of the side terminal of the semiconductor package of the first embodiment.
Figure 20:
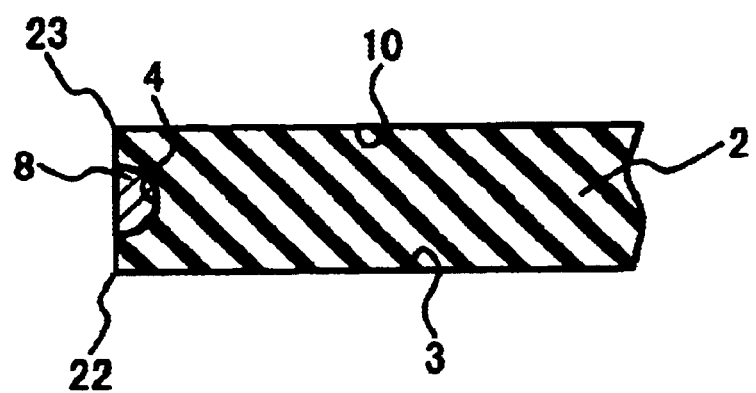
FIG. 20 is a view showing another illustrative, non-limiting embodiment of a third variation of the structure of the side terminal of the semiconductor package of the first embodiment.

Also, an intersection line given by the side surface 4 and a surface vertical to the rear surface 3 is not limited to a straight line, as shown in FIGS. 13 to 18. For example, as shown in FIG. 14 and FIG. 20, the side terminal 8 can be embedded in a concave position in the side surface 4. The polygonal intersection line given by the side surface 4 and the surface vertical to the rear surface 3 increases the sureness in the junction between the side terminal 8 and the package body 2.

Moreover, as shown in FIGS. 13, 14, 16 and 18, it is possible to design the configuration that the side terminal 8 does not bridge between the first and second intersection lines 22, 23. Also, as shown in FIG. 14, it is possible to design the configuration in which the side terminal 8 is not in contact with both the first and second intersection lines 22, 23.

Also, as shown in FIGS. 15 to 18, the side terminal 8 can extend from the first intersection line 22, toward a direction which is vertical to the first intersection line 22 and parallel to the rear surface 3. This improves the sureness in the junction between the side terminal 8 and the package body 2. At the same time, the reliability of the junction can be improved when the side terminal 8 and the second pad 14 are joined through the second solder 15 to each other.

Moreover, as shown in FIG. 17, the side terminal 8 can extend from the second intersection line 23, toward a direction that is vertical to the second intersection line 23 and parallel to the rear surface 3. This improves the sureness of the junction between the side terminal 8 and the package body 2.

The side terminal 8 can be formed not only in the corner of the package body 2 but also in any portion on the side. However, from the viewpoint of the reduction in the stress, it is desirable to form the side terminal 8 in the vicinities of the corner.

Figure 19:
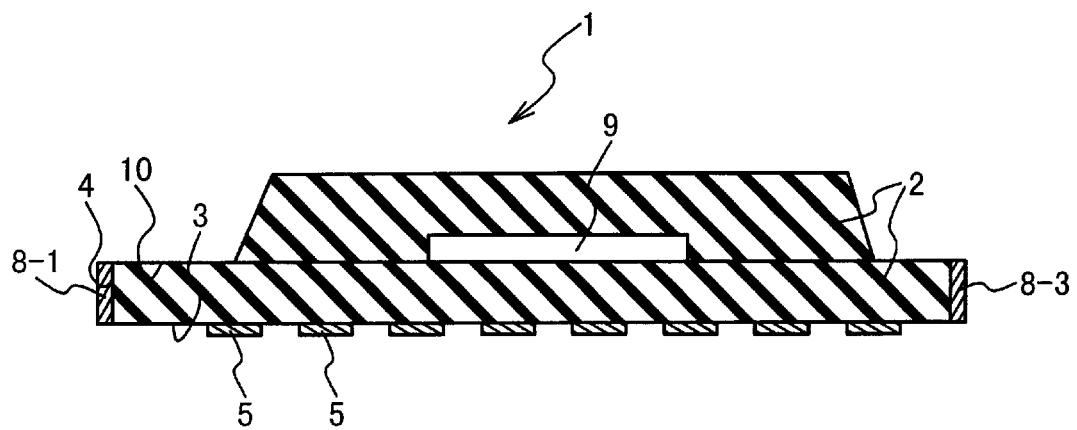
FIG. 19 is a section view showing a third variation of the structure of the semiconductor package of the first embodiment.

Also, a configuration shown in FIG. 19 can be designed. That is, the solder ball 6 is not joined, in the surface mount package 1 of the first embodiment. The rear terminals 5 are used as lands for the wiring, similarly to the BCC package and the SON package. In this case, the rear terminals 5 are directly joined to the first pads 13 of the printed circuit board 11.

Moreover, in the electronic device of the first embodiment, it is possible to design the configuration that the second pad 14 is not connected to another electronic element. At this time, the side terminal 8 and the second pad 14 do not carry out any electrical operation. It is possible to disperse and reduce the stresses acting on the solder balls 6-2 at the four corners without any electrical action.

Also, the second pad 14 can be fixed at the ground potential. It is not desirable that a conductor whose potential is not settled is mounted in the electronic part. So, this maintains the potential of the second pad 14 constant and makes the operation of the electronic part stable, if the side terminal 8 is not used as the outer terminal.

In the electronic device and the surface mount package 1 according to the present embodiment, the stress is weak which acts on the solder ball 6 of the surface mount package 1. In particular, the stress is weak which acts on the solder ball 6-2 at each of the four corners. This is because the induced stress is dispersed in the solder ball 6 and the second solder coupling 15.

Figure 1:
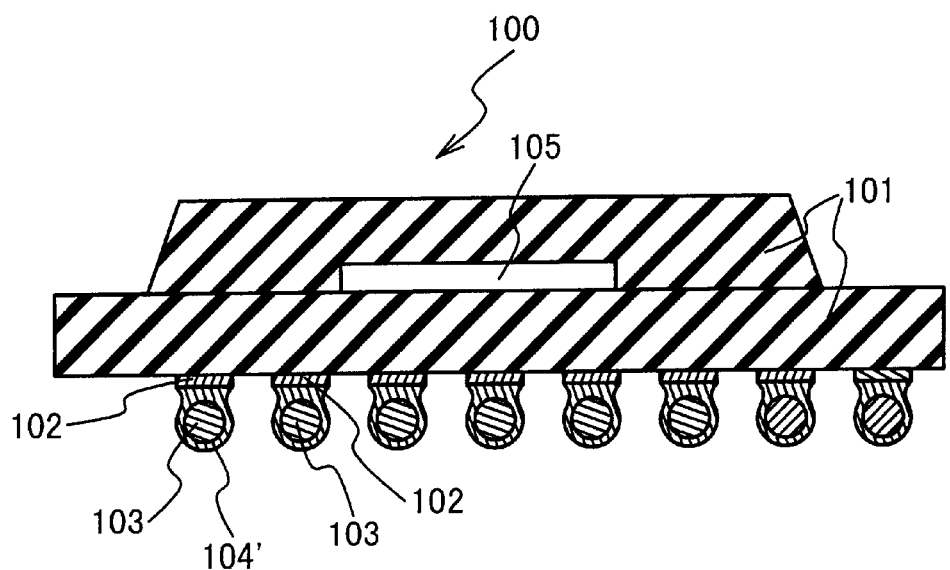
FIG. 1 is a section view showing a structure of a conventional BGA package.
Figure 2:
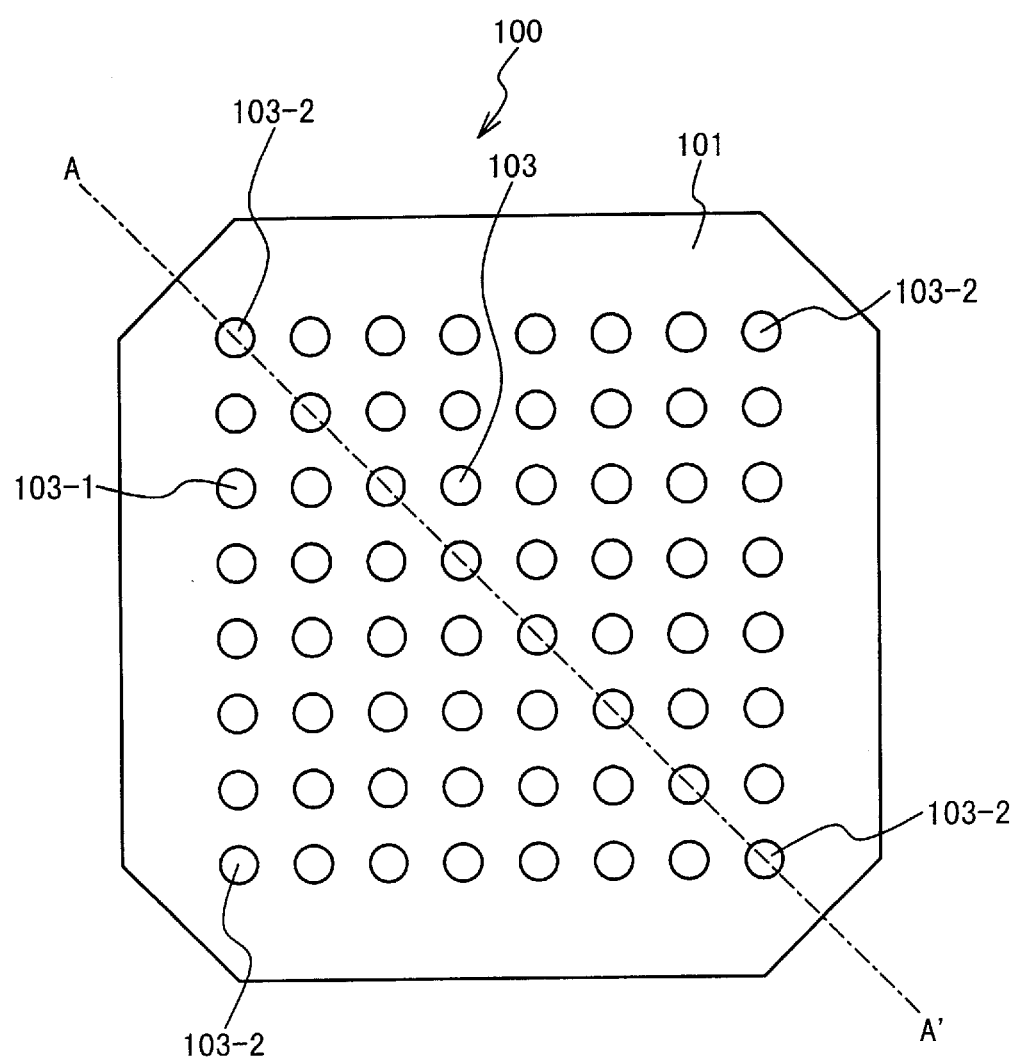
FIG. 2 is a plan view showing a structure of a conventional BGA package.
Figure 3:
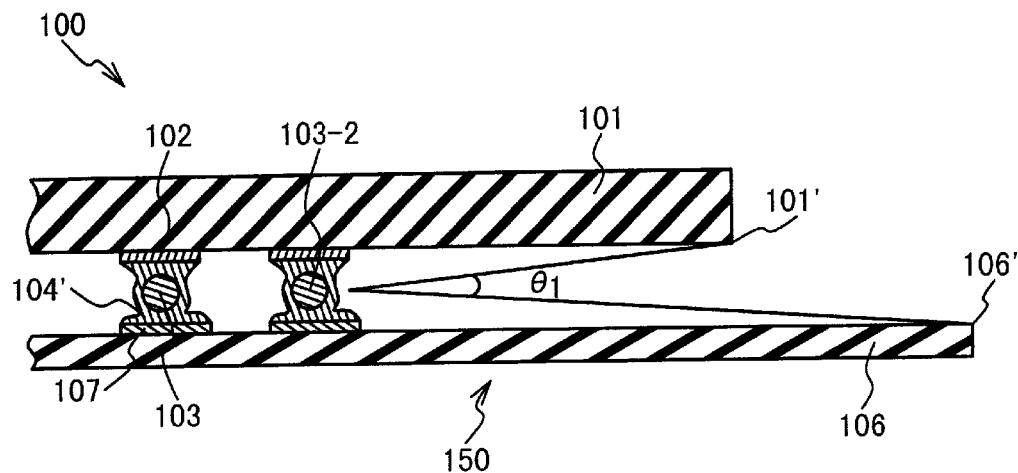
FIG. 3 is a section view showing a structure of a conventional electronic part.
Figure 4:
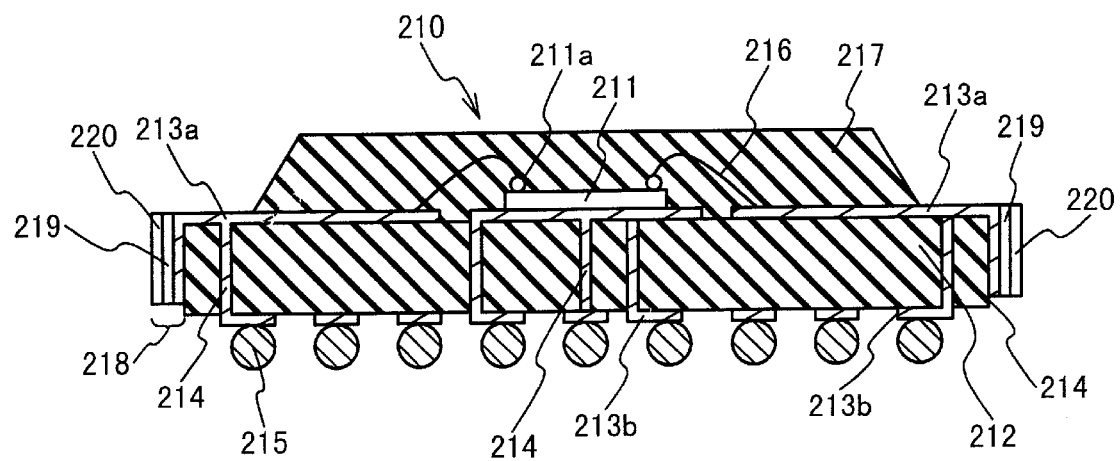
FIG. 4 is a section view showing a structure of another conventional BGA package.
Figure 5:
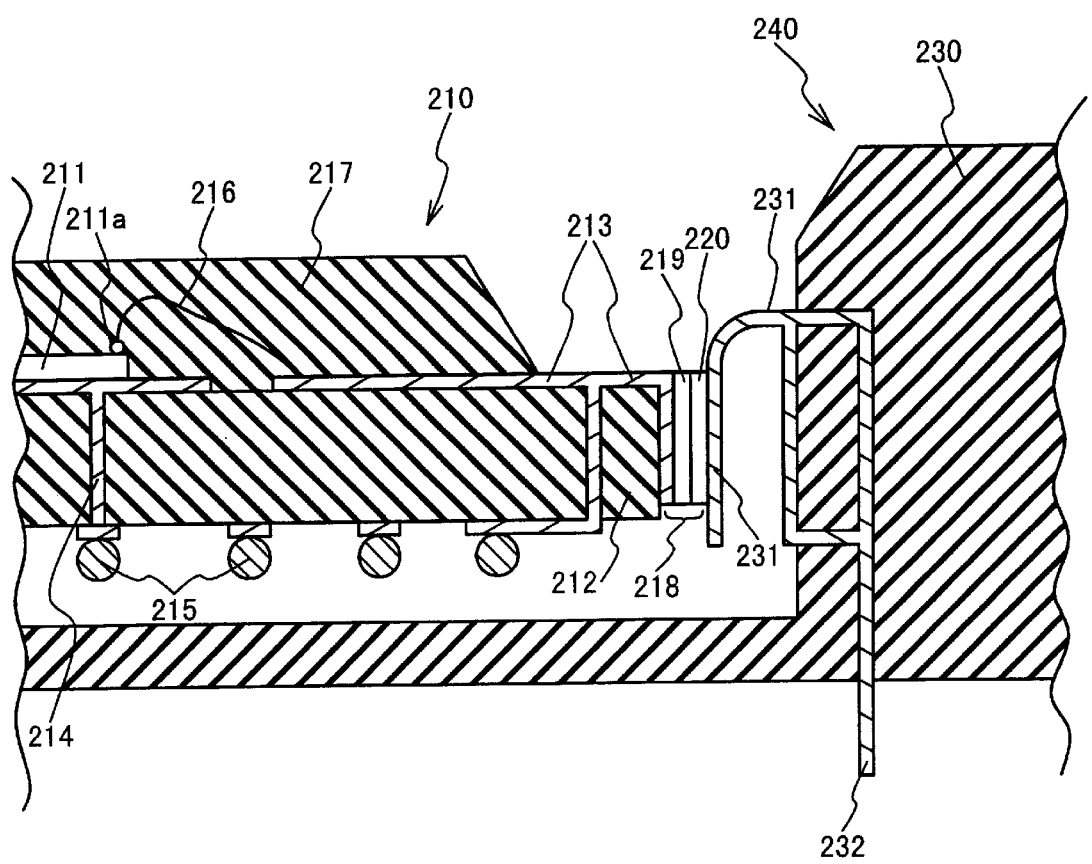
FIG. 5 is a view showing a structure of a socket into which another conventional BGA package is inserted.

The stress acting on the second solder coupling 15 is weaker than the stress acting on each of the solder balls 103-2 at the four corners of the conventional BGA package 100. This reason is as follows. In the conventional BGA package 100 shown in FIG. 3, an angle $\theta_1$ is close to 00 Here, the angle $\theta_1$ is an angle given by a segment connecting an end 101' of the package body 101 and the solder balls 103-2, and another segment connecting an end 106' of the substrate 106 and the solder balls 103-2. In the surface mount type package 1 of the present embodiment, as shown in FIG. 11, an angle $\theta_2$ is greater than 900. Here, the angle $\theta_2$ is an angle given by a segment connecting an end 1' of the surface mount package 1 and the second solder coupling 15, and another segment connecting an end 12' of the substrate 12 and the second solder coupling 15.

If the stress acts on the structure having a notch, such as a structure formed between the surface mount package 1 and the printed circuit board 11, the strength of the stress depends on an open angle of the notch and a curvature of a bottom of the notch. If the open angle of the notch is small, the stress is concentrated on the acted point. This fact is supported by literatures of "Damage Model in Stress Concentration Part for Fatigue Design CAD/CAE System", (Lecture Theses at Lecture Meeting of Material Strength Department in Japanese Mechanical Institute, Vol.A, (1998) p.13–p.16.), and "Engineering Against Fatigue" (Proceedings of an International Conference of the Importance of Understanding the Fundamentals of the Fatigue Process in Counteracting its Effects in Engineering Components and Structures, and to Reflect on the Contribution of K. J. Miller, (1999) p.373–p.380.)

In the surface mount type package 1 of the present invention, the side terminal 8 is mounted such that the side terminal 8 and the printed wiring substrate 12 are joined to each other. The above-mentioned angle $\theta_2$ can be made larger. Thus, it is possible to suppress the stress acting on the second solder coupling 15 serving as the acted point.

In the electronic device and the surface mount package according to the present embodiment, the stress acting on the terminal formed on the rear of the package is weak to thereby make the electrical mechanical reliability higher. Moreover, in the electronic device and the surface mount package according to the present embodiment, the stress caused by the heating operation is not concentrated on one of the terminals formed on the rear of the package.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A surface mount package comprising:
a body for mounting on a surface of a substrate, wherein the body comprises:
a front surface;
a rear surface; and
a plurality of side surfaces which intersect to form corners of said body; and
a plurality of corner terminals formed on corners of said body and each of said plurality of corner terminals comprising a substantially planar exterior connecting surface;
a plurality of rear solder couplings connecting said plurality of corner terminals formed on said portion of said rear surface of said body to a plurality of pads formed on a substrate upon which said surface mount package is mounted; and
a plurality of side solder couplings respectively connecting said substantially planar exterior connecting surface of each of said plurality of corner terminals formed on said portion of said side surface of said body to a plurality of pads formed on said substrate upon which said surface mount package is mounted.

2. The surface mount package according to claim 1, wherein said plurality of rear solder couplings electrically connect said plurality of corner terminals formed on said portion of said rear surface of said body to said plurality of pads formed on said substrate upon which said surface mount package is mounted.

3. The surface mount package according to claim 1, wherein said plurality of side solder couplings electrically connect said plurality of corner terminals formed on said portion of said side surface of said body to said plurality of pads formed on said substrate upon which said surface mount package is mounted.

4. The surface mount package according to claim 3, wherein said plurality of pads are earth grounded.

5. The surface mount package according to claim 1, wherein an end of said body, one of said solder couplings, and an end of said substrate form an angle θ2, wherein said angle θ2 is greater than 90°.

6. The surface mount package according to claim 1, wherein said substrate is a printed wiring board.

7. The surface mount package according to claim 1, wherein said plurality of solder couplings comprises a solder ball surrounded by a solder layer.

8. The surface mount package according to claim 1, wherein said corners of said body are beveled at a predetermined angle.

9. The surface mount package according to claim 1, further comprising a plurality of rear terminals and corresponding solder couplings disposed adjacent to said plurality of corner terminals.

10. The surface mount package according to claim 1, wherein at least one of said plurality of side surfaces of said body is neither perpendicular nor parallel to said planar exterior connecting surface of one of said plurality of corner terminals.

11. The surface mount package according to claim 1, wherein said plurality of corner terminals are embedded in said corners of said body.

12. The surface mount package according to claim 1, wherein said corners form a predetermined shape and said corner terminals are correspondingly formed to engage said predetermined shape of said corners.

13. The surface mount package according to claim 1, wherein said corner terminals are at an angle with respect to a plain of said rear surface.

14. The surface mount package according to claim 1, wherein said plurality of corner terminals are embedded in a concave position in said corners.

15. A surface mount package comprising:
   a body for mounting on a surface of a substrate, wherein the body comprises:
      a front surface;
      a rear surface; and
      a plurality of side surfaces which intersect to form corners of said body; and
   a plurality of corner terminals formed on corners of said body; wherein said plurality of corner terminals do not intersect either the front surface or the rear surface of the body;
   a plurality of rear solder couplings connecting said plurality of corner terminals formed on said portion of said rear surface of said body to a plurality of pads formed on a substrate upon which said surface mount package is mounted; and
   a plurality of side solder couplings connecting said plurality of corner terminals formed on said portion of said side surface of said body to a plurality of pads formed on said substrate upon which said surface mount package is mounted;
      wherein at least one of said plurality of side surfaces of said body is not perpendicular to said rear surface of said body.

16. A surface mount package comprising:
   a body for mounting on a surface of a substrate, wherein the body comprises:
      a front surface and a rear surface;
      a plurality of side surfaces which intersect to form corners of the body; and
   wherein the surface mount package further comprises:
      a corner terminal embedded in each of the corners; and
      a side solder coupling which connects each corner terminal to a corresponding pad formed on the substrate upon which the surface mount package is mounted; and
      wherein the corner terminal does not intersect the front surface or the rear surface.

17. The surface mount package of claim 16, wherein a beveled surface is formed at each of the corners; and said beveled surface intersects the front surface, rear surface, and at least two of the plurality of side surfaces.

18. The surface mount package of claim 16,
   wherein an embedded portion of the corner terminal has a curved shape; and
   wherein each respective corner includes a recess that has a shape which corresponds to the shape of the corner terminal.

19. The surface mount package of claim 16,
   wherein an embedded portion of the corner terminal has a rectangular shape; and
   wherein each respective corner includes a recess that has a shape which corresponds to the shape of the corner terminal.

20. A surface mount package comprising:
   a body for mounting on a surface of a substrate, wherein the body comprises:
      a front surface and a rear surface;
      a plurality of side surfaces which intersect to form corners of the body; and
   wherein the surface mount package further comprises:
      a corner terminal formed on each of the corners; and
      a side solder coupling which connects each corner terminal to a corresponding pad formed on the substrate upon which the surface mount package is mounted; and
      wherein at least one of the plurality of side surfaces is not perpendicular to at least one of the front surface and the rear surface.

21. The surface mount package of claim 20, wherein the at least one of the plurality of side surfaces which is not perpendicular to at least one of the front surface and the rear surface is a planar surface.

22. The surface mount package of claim 20,
   wherein each corner terminal has a hexagonal shape; and
   wherein the corners of the body each have a shape which corresponds to the shape of each respective corner terminal.

23. The surface mount package of claim 20,
   wherein the corner terminal is embedded in a portion of at least one of the front surface and the rear surface.

24. The surface mount package of claim 20, wherein the corner terminal is embedded in a portion of both the front surface and the rear surface.

* * * * *